US 10,873,233 B2

(12) United States Patent
Nishikawa et al.

(10) Patent No.: US 10,873,233 B2
(45) Date of Patent: Dec. 22, 2020

(54) CASE OF ELECTRIC APPARATUS AND MANUFACTURING METHOD THEREFOR

(71) Applicant: Mitsubishi Electric Corporation, Tokyo (JP)

(72) Inventors: Hideya Nishikawa, Tokyo (JP); Yoshihito Asao, Tokyo (JP); Tomo Ide, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 245 days.

(21) Appl. No.: 15/738,205

(22) PCT Filed: Oct. 8, 2015

(86) PCT No.: PCT/JP2015/078587
§ 371 (c)(1),
(2) Date: Dec. 20, 2017

(87) PCT Pub. No.: WO2017/060999
PCT Pub. Date: Apr. 13, 2017

(65) Prior Publication Data
US 2018/0183294 A1    Jun. 28, 2018

(51) Int. Cl.
*H02K 5/10*  (2006.01)
*C09K 3/10*  (2006.01)
(Continued)

(52) U.S. Cl.
CPC ............... *H02K 5/10* (2013.01); *C08L 83/04* (2013.01); *C09K 3/10* (2013.01); *C09K 3/1018* (2013.01);
(Continued)

(58) Field of Classification Search
CPC ........................................................ H02K 5/10
See application file for complete search history.

(56) References Cited

U.S. PATENT DOCUMENTS

2003/0173100 A1*  9/2003  Flaherty ................. H05K 5/061
174/359
2014/0076772 A1   3/2014  Azumi et al.

FOREIGN PATENT DOCUMENTS

CN    103013123 A    4/2013
JP    09-098560 A    4/1997
(Continued)

OTHER PUBLICATIONS

Communication dated Sep. 23, 2019, from the State Intellectual Property Office of the P.R.C. in application No. 201580083384.0.
(Continued)

*Primary Examiner* — Daniel H Lee
(74) *Attorney, Agent, or Firm* — Sughrue Mion, PLLC; Richard C. Turner

(57)  ABSTRACT

There is provided a case of an electric apparatus and the manufacturing method therefor in which a sealing material, the portion of which at the depth is cured without being heated, is utilized at the junction portion of two or more case members. The case of the electric apparatus has a gap forming portion that form a gap in a junction portion where two or more case members for containing an electric apparatus are joined to each other and a sealing material filled into the gap between the gap forming portion; the sealing material is a two-liquid-mixed addition-reaction-curable sealing material that has a normal-temperature curability and includes a platinum catalyst.

4 Claims, 8 Drawing Sheets

(51) Int. Cl.
*F16J 15/14* (2006.01)
*H05K 5/06* (2006.01)
*C08L 83/04* (2006.01)
*H02K 11/30* (2016.01)
*H02K 15/12* (2006.01)
*H02K 15/14* (2006.01)
*C08G 77/20* (2006.01)
*C08G 77/12* (2006.01)

(52) U.S. Cl.
CPC .............. *F16J 15/14* (2013.01); *H02K 11/30* (2016.01); *H02K 15/12* (2013.01); *H02K 15/14* (2013.01); *H05K 5/062* (2013.01); *C08G 77/12* (2013.01); *C08G 77/20* (2013.01)

(56) References Cited

FOREIGN PATENT DOCUMENTS

| | | |
|---|---|---|
| JP | 2001-216979 A | 8/2001 |
| JP | 2004-193490 A | 7/2004 |
| JP | 2010-056493 A | 3/2010 |
| JP | 2014-60307 A | 4/2014 |
| JP | 2014-086682 A | 5/2014 |
| JP | 2014086682 A * | 5/2014 |
| JP | 2015-002282 A | 1/2015 |
| JP | 2015002282 A * | 1/2015 |

OTHER PUBLICATIONS

Communication dated Apr. 10, 2019 from European Patent Office in counterpart EP Application No. 15905819.7.
International Search Report for PCT/JP2015/078587 dated Jan. 12, 2016 [PCT/ISA/210].
Written Opinion for PCT/JP2015/078587 dated Jan. 12, 2016 [PCT/ISA/237].
Communication dated Jul. 24, 2018 from the Japanese Patent Office in counterpart Application No. 2017-544125.
Communication dated Mar. 17, 2020 from the State Intellectual Property Office of the P.R.C. in counterpart Application No. 201580083384.0.

* cited by examiner

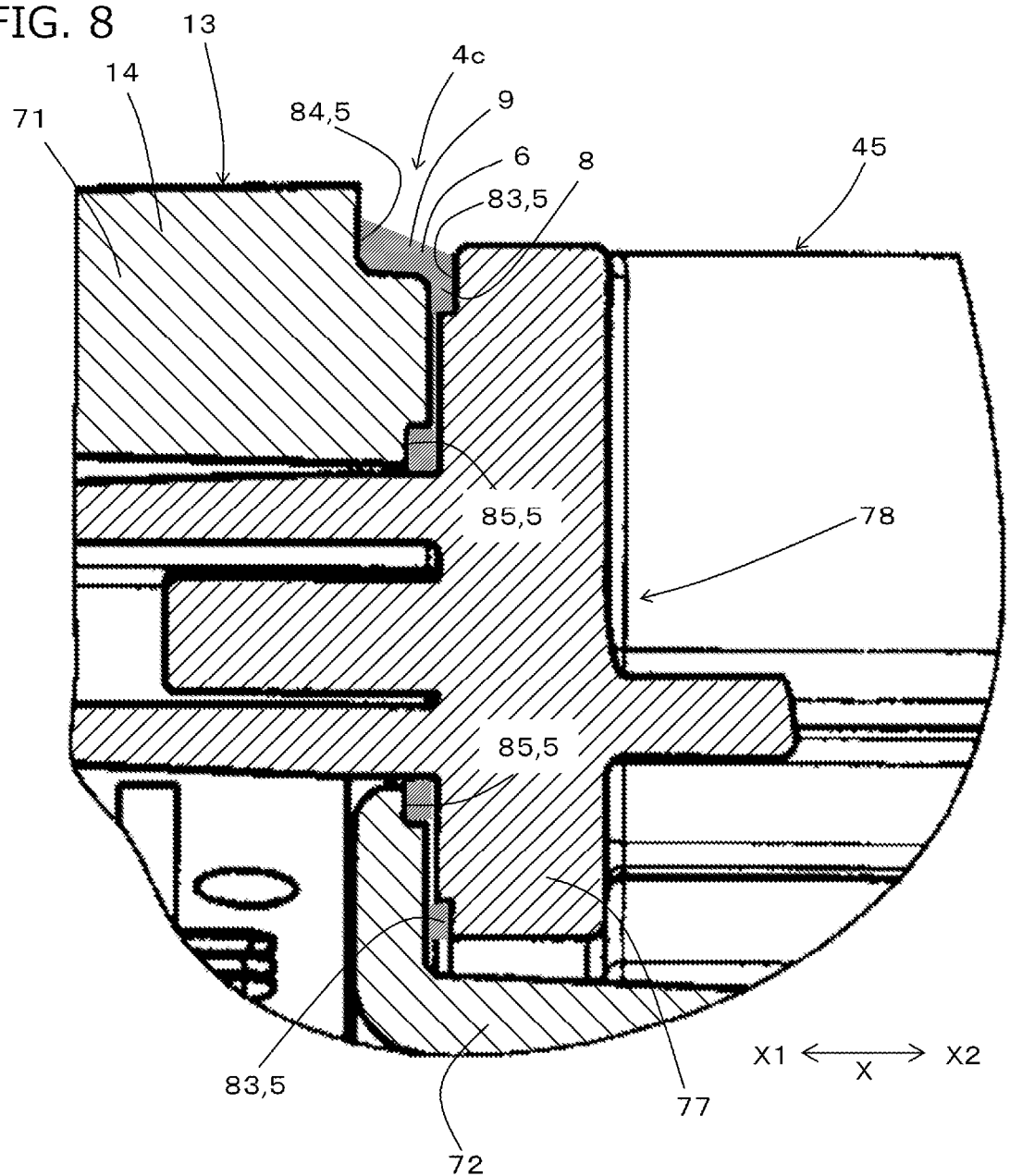

CASE OF ELECTRIC APPARATUS AND MANUFACTURING METHOD THEREFOR

CROSS REFERENCE TO RELATED APPLICATIONS

This application is a National Stage of International Application No. PCT/JP2015/078587 filed Oct. 8, 2015, the contents of all of which are incorporated herein by reference in their entirety.

TECHNICAL FIELD

The present invention relates to a case of an electric apparatus provided with two or more case members that are joined to each other and relates to the manufacturing method therefor.

BACKGROUND ART

With regard to such a case as described above, the cases disclosed in PLT 1 and PLT 2, described later, are known. In the technology disclosed in PLT 1, the junction portion of each of two or more case members is configured with a groove portion and a protruding portion that is inserted into the groove portion, and a sealing material is filled into the gap between the grove portion and the protruding portion.

In the technology disclosed in PLT 2, ultraviolet cleaning is applied to the portion, in which the lower side face 15b of the flange portion 15a of the bearing holder faces the lower side face 15 of the upper case member 46, and the like; the surfaces of these portions are appropriately roughened, and then, the sealing material 80 is filled into the surfaces and is cured (refer to Paragraph 0038, FIG. 5, and the like of PLT 2).

CITATION LIST

Patent Literature

PLT 1: JP-A-2010-56493
PLT 2: JP-A-H9-98560

SUMMARY OF INVENTION

Technical Problem

However, PLT 1 does not disclose what kind of sealing material is utilized. For example, in the case where as the sealing material, an ordinary condensation-reaction-curable sealing material, which is cured with air moisture, is utilized, the curability of the depth that is away from the surface is not sufficient. Therefore, there has been a problem that when the depth of the gap is enlarged in order to raise the junction strength and the airtightness, it takes a long time for the depth to be cured and hence the productivity is deteriorated or the moisture does not reach the depth and hence the depth is not cured; or, for example, in the case where as the sealing material, a sealing material that requires heating for curing is utilized, there has been a problem that because it is necessary to perform heating so as to cure the sealing material up to the depth, the heating time becomes long and hence the productivity is deteriorated.

In the technology disclosed in PLT 2, as the sealing material, an ultraviolet-curable resin is utilized. However, there has been a problem that an ultraviolet apparatus is required and hence the cost of equipment increases.

Accordingly, there is desired a case of an electric apparatus and the manufacturing method therefor in which a sealing material, the portion of which at the depth is cured without being heated, is utilized at the junction portion of two or more case members.

Solution to Problem

A case of an electric apparatus according to the present invention has a gap forming portion that forms a gap in a junction portion where two or more case members for containing an electric apparatus are joined to each other and a sealing material filled into the gap of the gap forming portion; the sealing material is a two-liquid-mixed addition-reaction-curability and includes a platinum catalyst.

A manufacturing method for a case of an electric apparatus according to the present invention includes an assembly process in which two or more case members are combined with each other while an electric apparatus is contained therein and an uncured two-liquid-mixed sealing material is filled into a gap formed in a junction portion where the two or more case members are joined to each other and a heating process in which the sealing material filled in the assembly process is heated; the sealing material is a two-liquid-mixed addition-reaction-curable sealing material that has a normal-temperature curability and a thermal-curing facilitation property and that includes a platinum catalyst.

Advantage of the Invention

In a case of an electric apparatus according to the present invention, a gap forming portion forms a gap in a junction portion and a sealing material is filled into the gap, so that a layer of the sealing material can be formed in the junction portion. Due to the action of a platinum catalyst, merely by mixing two liquids, an addition reaction develops in the whole sealing material at a normal temperature and the sealing material is cured. Because the whole sealing material can securely be cured, the airtightness can be raised. Moreover, because the time in which the whole sealing material is cured can be shortened, the productivity can be raised. Furthermore, because the sealing material has a normal-temperature curability, it is not required to provide the manufacturing facilities for heating; or, because even in the case where curing is facilitated by heating, it is not required to perform heating up to the depth so as to completely cure the whole sealing material, the heating time can appropriately be shortened and hence the productivity can be raised.

In the manufacturing method for a case of an electric apparatus according to the present invention, after the uncured sealing material is filled in the assembly process, the sealing material is heated in the heating process; thus, it is made possible to shorten the curing time so as to raise the productivity. Because the sealing material has a normal-temperature curability, it is not required to perform heating up to the depth so as to completely cure the whole sealing material, the heating time can appropriately be shortened and hence the productivity can be raised.

BRIEF DESCRIPTION OF THE DRAWINGS

FIG. 8 is a principal-part cross-sectional view of a junction portion according to Embodiment 2 of the present invention.

DESCRIPTION OF EMBODIMENTS

1. Embodiment 1

Figure 1:
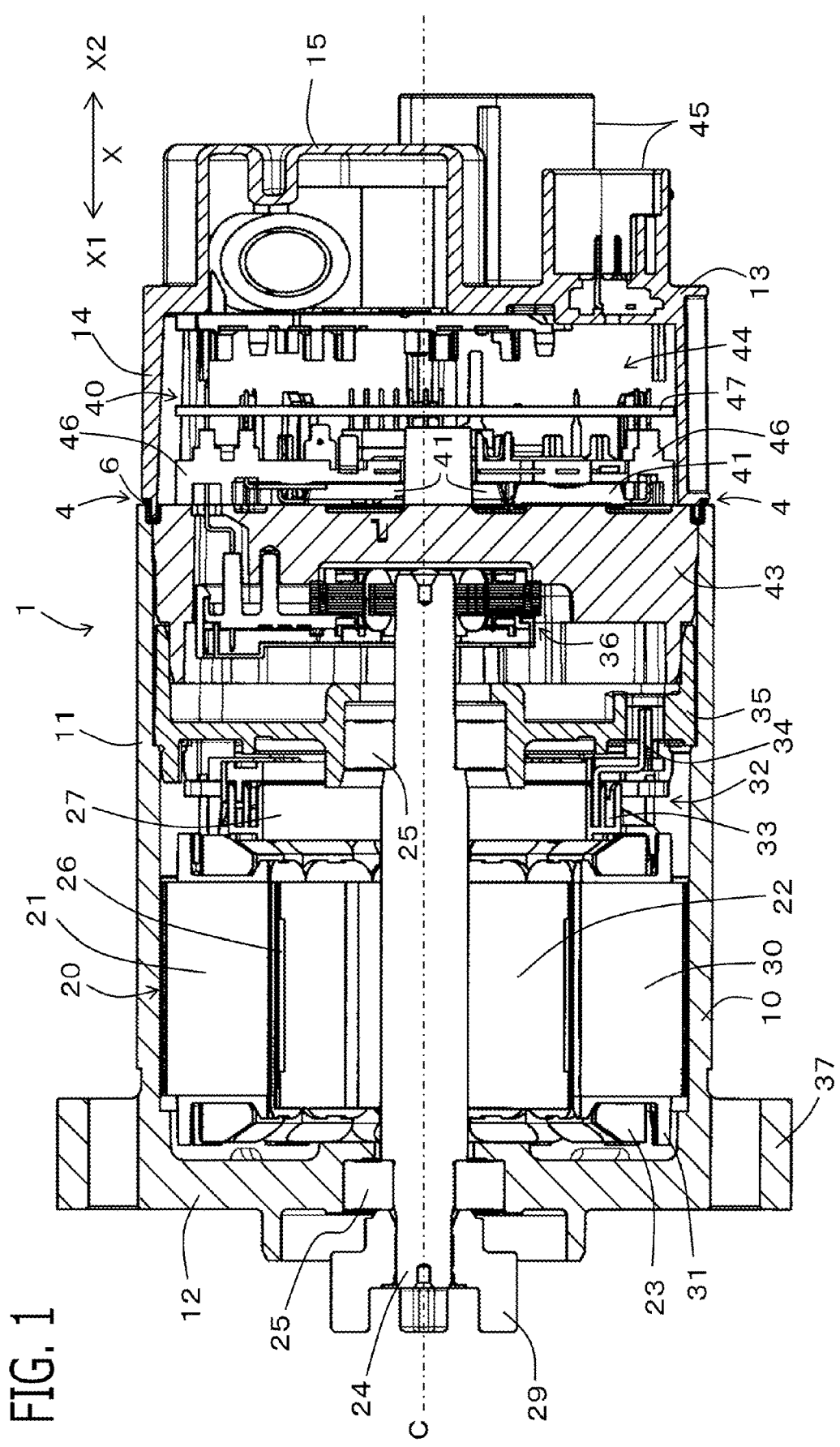
FIG. 1 is a cross-sectional view of a motor, a motor control apparatus, and a case according to Embodiment 1 of the present invention.
Figure 2:
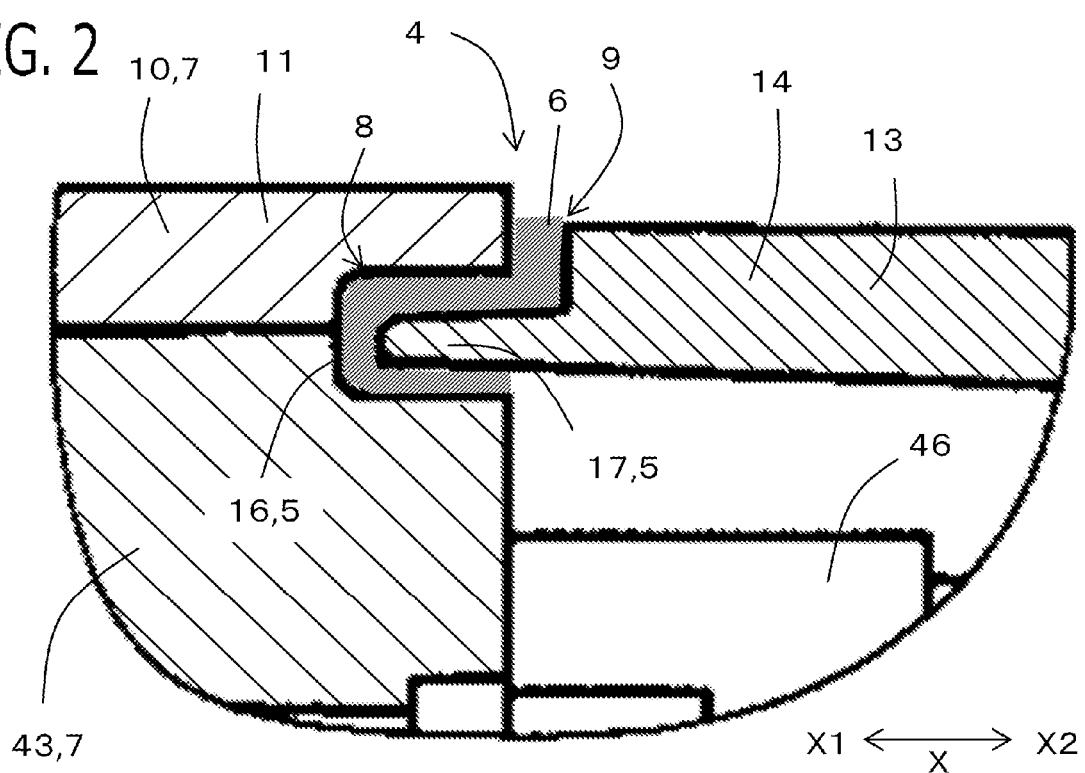
FIG. 2 is a principal-part cross-sectional view of a junction portion according to Embodiment 1 of the present invention.

A case 1 of an electric apparatus (hereinafter, referred to simply as a case 1) according to Embodiment 1 will be explained with reference to drawings. In Embodiment 1, the electric apparatus to be contained in the case 1 is an integrated unit including both a motor 20 and a motor control apparatus 40. FIG. 1 is a cross-sectional view of the integrated unit and the case 1, taken along a plane that passes through the rotation axle center C of the motor 20. FIG. 2 is a principal-part cross-sectional view in which a junction portion of the case 1 in FIG. 1 is enlarged.

The direction parallel to the rotation axle center C of the motor 20 is defined as an axle direction X; one side of the axle direction X is defined as an axle-direction first side X1; the side opposite to the axle-direction first side X1 in the axle direction X is defined as an axle-direction second side X2. The radial direction and the circumferential direction are defined as those with respect to the rotation axle center C.

1-1. The Schematic and Arrangement Configuration of the Motor 20, the Motor Control Apparatus 40, and the Case 1

<Motor 20>

The motor 20 has a cylindrical tubular stator 21 and a cylindrical tubular rotor 22 that is disposed at the radial-direction inner side of the stator 21 and is pivotably supported by bearings 25. In Embodiment 1, the motor 20 is a permanent-magnet synchronous motor; a coil 23 is wound around the stator 21, and a permanent magnet 26 is fixed to the rotor 22 (the outer circumferential surface of the rotor 22, in this example).

The outer circumferential surface of the stator 21 is fitted and fixed to the inner circumferential surface of a motor case 10. The motor case 10 is formed in the shape of a bottomed cylindrical tube provided with a cylindrical tubular first circumferential wall 11 that covers the radial-direction outer sides of the motor 20 and the like and a disk-shaped first sidewall 12 that covers the opening, at the axle-direction first side X1, of the first circumferential wall 11. The motor case 10 is made of a heat-conductive metal material. The rotor shaft 24 is formed in the shape of a cylindrical column that extends in the axle direction X on the rotation axle center C. The inner circumferential surface of the rotor 22 is fitted and fixed to the outer circumferential surface of the rotor shaft 24. The rotor shaft 24 extends at the both sides, in the axle direction X, of the rotor 22; the respective portions, in the axle direction X, at the both sides of the rotor shaft 24 are pivotably supported with respect to the motor case 10 by the bearings 25.

In the center portion of the first sidewall 12, a through-hole that penetrates the first sidewall 12 in the axle direction X is formed. The rotor shaft 24 penetrates the through-hole in the first sidewall 12; the inner circumferential surface of the through-hole pivotably supports the rotor shaft 24 through the intermediary of the bearing 25. A coupling portion 29 having a spline groove or the like for coupling the rotor shaft 24 with an external mechanism (unillustrated) is fixed on the portion, of the rotor shaft 24, that penetrates the first sidewall 12 and extends toward the axle-direction first side X1. The motor 20 is utilized, for example, as the driving force source for an electric power steering; the coupling portion 29 is coupled with the worm of a worm-gear mechanism in the electric power steering.

The stator 21 has a stator core 30 in which electromagnetic steel sheets are stacked in the axle direction X and that has teeth protruding toward the radial-direction inner side, a coil bobbin 31 that is made of an insulating material such as resin and mounted on the teeth of the stator core 30, and a coil 23 wound around each of the teeth through the intermediary of the coil bobbin 31. Two or more teeth are provided in such a way as to be spaced evenly apart from one another in the circumferential direction. The stator core 30 is divided for each tooth. Each of the coil bobbin 31 and the coil 23 has portions that protrude from the stator core 30 toward both respective sides in the axis-direction; each of the protruding portions forms a coil end.

At the axle-direction second side X2 of the stator 21 (the coil end at the axle-direction second side X2), the motor 20 has a cylindrical tubular coil connecting portion 32 where both the terminals of the coil 23 wound on each tooth are connected with each other so as to form a delta connection or a star connection. The coil connecting portion 32 has two or more connection wires 33 that extend in the circumferential direction and with which the terminals of the coil 23 are connected with each other and a coil connection holder 27 that is made of resin and in which cylindrical tubular grooves for holding connection wires 33 are radially formed in two or more steps. Two terminal wires extend from each of the coils 23 toward the axle-direction second side X2 and then are connected with the coil connecting portion 32 (the connection wires 33). Three motor connection wires 34 that connect the respective three-phase terminals of the delta connection or the star connection in the coil connecting portion 32 with a power supply circuit side extend from the coil connecting portion 32 (the connection wires 33) toward the axle-direction second side X2.

At the axle-direction second side X2 of the motor 20, a motor sidewall 35, which is the sidewall thereof at the axle-direction second side X2, is provided. The motor sidewall 35 is made of a metal material. The motor sidewall 35 is formed in the shape of a disk having a through-hole at the central part thereof. A cylindrical tubular internal boss portion where the through-hole is formed is provided at the radial-direction inner end portion of the motor sidewall 35. The rotor shaft 24 penetrates the through-hole in the motor sidewall 35; the inner circumferential surface of the through-hole pivotably supports the rotor shaft 24 through the intermediary of the bearing 25. A cylindrical tubular external boss portion is provided at the radial-direction outer end portion of the motor sidewall 35. The outer circumferential surface of the external boss portion is fitted and fixed to the inner circumferential surface of the first circumferential wall 11 of the motor case 10.

<Motor Control Apparatus 40>

The motor control apparatus 40 has a power supply circuit provided with switching devices that each perform on/off-switching of power supply from the power source to the motor 20, a control circuit 44 that performs on/off-control of the switching devices in the power supply circuit, and a heat sink 43 that radiates heat generated in the power supply circuit. The motor control apparatus 40 is also provided with a resolver 36.

In Embodiment 1, the power supply circuit is an inverter that converts DC electric power supplied from the power source into AC electric power and then supplies the AC electric power to the motor 20. The power supply circuit is a bridge circuit in which three series circuits, which each include two switching devices connected in series with each other between a positive-electrode wire and a negative-electrode line that are connected with the power source, are connected in parallel with one another in such a manner as to correspond to the respective three phases. That is to say, the power supply circuit is a three-phase inverter provided with six switching devices. As the switching device, a power MOSFET (Metal Oxide Semiconductor Field Effect Transistor), an IGBT (Insulated Gate Bipolar Transistor) with which a free-wheel diode is connected in an anti-parallel manner, or the like is utilized. In addition to the switching devices, the power supply circuit includes a capacitor for smoothing the power-source voltage, a shunt resistor for detecting an electric current supplied to the motor 20, and the like.

The power supply circuit is formed of a power module 41 in which as a single component, connection wires and two or more devices such as switching devices are integrated. In Embodiment 1, the power supply circuit is configured with two or more (e.g., three) power modules 41. For example, a single power module 41 is the one in which as a single component, a series circuit including two switching devices and a shunt resistor are integrated. In the power module 41, two or more devices and connection wires are sealed with a molding resin or the like, and the sealed portion is formed in the shape of a plate (for example, a rectangular plate).

The control circuit 44 has a microcomputer that performs calculation processing, an input circuit that inputs, to the microcomputer, the output signals of sensors such as the resolver 36 and the shunt resistor and external signals from external apparatuses, a driving circuit that performs on/off-driving of the switching devices, and the like. The constituent components of the control circuit 44, such as the microcomputer, the input circuit, the driving circuit, and the like are mounted on a tabular substrate 47 made of a non-conductive materials such a glass fiber or an epoxy resin.

The motor control apparatus 40 is provided with a connection wire module 46. The connection wire module 46 is a single component in which two or more connection wires for mutually connecting the power supply circuit, the control circuit 44, the motor 20, the power-source connection terminals, the sensor such as the resolver 36, and the like are integrated. In the connection wire module 46, two or more connection wires are sealed with a molding resin, and the sealed portion is formed in the shape of a plate.

The heat sink 43 is made of a high-heat-conductivity metal material such as aluminum. The heat sink 43 abuts against the power module 41 provided with switching devices and the like; heat generated by the power module 41 and the like is transferred to the heat sink 43. The other components of the motor control apparatus 40, for example, a smoothing capacitor and the like may abuts against the heat sink 43. The heat sink 43 radiates the heat transferred thereto.

The motor control apparatus 40 is disposed at the axle-direction second side X2 of the motor 20.

The heat sink 43 is disposed at the axle-direction second side X2 of the motor sidewall 35 and the rotor shaft 24. The heat sink 43 is formed in the shape of a cylindrical column and covers the opening, at the axle-direction second side X2, of the motor case 10. The outer circumferential surface of the heat sink 43 is fitted and fixed to the inner circumferential surface of the first circumferential wall 11 of the motor case 10. Although the detail will be described later, the heat transferred from the power module 41 and the like to the heat sink 43 is transferred to the motor case 10, through the intermediary of the fitting portion. The heat transferred to the motor case 10 is radiated to the outside through the outer surface of the motor case 10 or is transferred to an external mechanism (the case of a worm-gear mechanism, in this example) to be coupled with the motor case 10 (a flange 37 of the motor case 10, in this example). In the heat sink 43, there are formed a through-hole (unillustrated), in the axle direction X, through which the motor connection wires 34 passes, a through-hole, in the axle direction X, through which the connection wires for the resolver 36 passes, and the like.

The resolver 36 is disposed at the axle-direction first side X1 of the heat sink 43. The resolver 36 has a resolver rotor and a resolver stator. The inner circumferential surface of the resolver rotor is fitted and fixed to the outer circumferential surface of the rotor shaft 24 that penetrates the motor sidewall 35 and extends toward the axle-direction second side X2. A resolver holder for holding the resolver stator and the connection wires therefor is fixed to the wall, at the axle-direction first side X1, of the heat sink 43.

The power module 41 is disposed at the axle-direction second side X2 of the heat sink 43. The surface, at the axle-direction first side X1, of the power module 41 abuts against the surface, at the axle-direction second side X2, of the heat sink 43; thus, heat is transferable. The connection wire module 46 is disposed at the axle-direction second side X2 of the heat sink 43 and the power module 41. A leg portion of the connection wire module 46 abuts against the surface portion, at the axle-direction second side X2, of the heat sink 43; the power module 41 does not abut against the foregoing surface portion. The control circuit 44 mounted on the substrate 47 is disposed at the axle-direction second side X2 of the connection wire module 46.

A control apparatus case 13 is formed in the shape of a bottomed cylindrical tube provided with a cylindrical tubular second circumferential wall 14 that covers the radial-direction outer side of the motor control apparatus 40 (in this example, the power module 41, the connection wire module 46, and the control circuit 44, excluding the heat sink 43 and the resolver 36) and a disk-shaped second sidewall 15 that covers the opening, at the axle-direction second side X2, of the second circumferential wall 14. The second sidewall 15 is provided with connectors 45 for the power source connection terminals to be connected with the power source, external connection terminals to be connected with external apparatuses, and the like. The external apparatuses are, for example, a torque sensor, a CAN communication apparatus, and the like. The control apparatus case 13 is made of resin. The end portion, at the axle-direction first side X1, of the second circumferential wall 14 of the control apparatus case 13 and the end portion, at the axle-direction second side X2, of the first circumferential wall 11 of the motor case 10 are joined to each other and form a junction portion 4, described later.

1-2. The Configuration of the Junction Portion 4 of the Case Member

The case 1 has a gap forming portion 5 that forms a gap in the junction portion 4 where two or more case members for containing an electric apparatus are joined to each other and a sealing material 6 filled into the gap of the gap forming portion 5. In Embodiment 1, in the junction portion 4 between the control apparatus case 13 and the motor case 10, the gap forming portion 5 forms a gap, and the sealing material 6 is filled into the formed gap. That is to say, a gap is formed in the junction portion 4 between the control apparatus case 13 and the motor case 10, and the sealing material 6 is filled into the gap.

In this configuration, the gap forming portion 5 forms a gap in the junction portion 4 and the sealing material 6 is filled into the gap, so that a layer of the sealing material 6 can be formed in the junction portion 4. The layer of the sealing material 6 makes it possible to secure the airtightness of the junction portion 4. However, when the sealing material 6 is not sufficiently cured, the junction strength and the airtightness cannot sufficiently be secured. In the case where unlike Embodiment 1, for example, a condensation-reaction-curable silicone, which is cured with air moisture, is utilized as the sealing material 6, the curability of the depth that is away from the surface is not sufficient. Therefore, there has been a problem that when the depth of the gap is enlarged in order to raise the junction strength and the airtightness, it takes a long time for the depth to be cured and hence the productivity is deteriorated or the moisture does not reach the depth and hence the depth is not cured; or, in the case where unlike Embodiment 1, for example, silicone that requires heating for curing is utilized as the sealing material 6, there have been problems that manufacturing facilities for heating are required and that because in order to cure the silicone, it is necessary to perform heating up to the depth, the heating time becomes long and hence the productivity is deteriorated.

Accordingly, the sealing material 6 is a two-liquid-mixed addition-reaction-curable sealing material that has a normal-temperature curability and includes a platinum catalyst. In the case of this configuration, due to the action of the platinum catalyst, merely by mixing two liquids, an addition reaction develops in the whole sealing material 6 at a normal temperature and the sealing material 6 is cured. Because the whole sealing material 6 can securely be cured, the airtightness can be raised. Moreover, because the time in which the whole sealing material 6 is cured can be shortened, the productivity can be raised. For example, even when in order to raise the junction strength and the airtightness, the depth of the gap is increased, excellent curing can be maintained. Furthermore, because the sealing material 6 has a normal-temperature curability, it is not required to provide the manufacturing facilities for heating; or, because even in the case where curing is facilitated by heating, it is not required to perform heating up to the depth so as to completely cure the whole sealing material 6, the heating time can appropriately be shortened and hence the productivity can be raised.

In Embodiment 1, the sealing material 6 has a thermal-curing facilitation property in addition to the normal-temperature curability. As described above, this configuration facilitates the curing by heating, shortens the curing time, and hence can raise the productivity. Even when some of the portions that are away from the heating surface are not cured by heating, the sealing material 6 is eventually cured at a normal temperature because it has a normal-temperature curability.

In Embodiment 1, the sealing material 6 is a silicone having the radical (—Si—CH$_2$—CH$_2$—Si—) obtained by applying platinum-catalyst crosslink to a silicone, as a first liquid, having the radical (—Si—H) and a silicone, as a second liquid, having the radical (—Si—CH=CH$_2$). Accordingly, the cured sealing material 6 is a silicone containing a platinum catalyst and having the radical (—Si—CH$_2$—CH$_2$—Si—). Because the sealing material 6 is such a silicone, it is made possible to obtain excellent post-curing junction strength and the airtightness of the junction portion 4

An example of the relationship between the temperature and the curing time till complete curing will be explained. The curing time at a normal temperature (e.g., 25° C.) is approximately one hour; the curing time at 80° C. is approximately five minutes; the curing time at 120° C. is approximately one minute. As this example, although the sealing material 6 can be cured even at a normal temperature, heating can largely shorten the curing time. The hardness at a time of complete curing is, for example, 27 to 31 (type A).

The motor case 10 and the control apparatus case 13 are fixed to each other by means of a fixation member such as a bolt (unillustrated). While the motor case 10 and the control apparatus case 13 are fixed to each other by means of a fixation member, the gap forming portion 5 forms a gap. Specifically, when the motor case 10 and the control apparatus case 13 are fixed to each other by means of a fixation member, the abutting portion of the motor case 10 and the abutting portion of the control apparatus case 13 abut against each other, so that the motor case 10 and the control apparatus case 13 position each other. While the motor case 10 and the control apparatus case 13 position each other, the gap forming portion 5 is formed so that a gap is formed.

The gap forming portion 5 forms an inner gap 8 and an outer gap 9, which is provided outside the inner gap 8 and opens toward the outside. The sealing material 6 is filled into the inner gap 8; then, the sealing material 6 that has overflown from the inner gap 8 can be stored in the outer gap 9. The sealing material 6 that is stored in the outer gap 9 is exposed to the outside; thus, when a heater 60 heats the sealing material 6 from the outside, the heat is readily transferred to the sealing material 6 and hence the sealing material 6 can be cured in a short time.

In Embodiment 1, the cylindrical tubular outer circumferential surface of the heat sink 43 is fitted to the cylindrical tubular inner circumferential surface of the end portion, at the axle-direction second side X2, of the motor case 10; the heat sink 43 covers the opening, at the axle-direction second side X2, of the motor case 10. In the fitting portion between the motor case 10 and the heat sink 43, the endface, at the axle-direction second side X2, of the motor case 10 and the endface, at the axle-direction second side X2, of the heat sink 43 are aligned with each other at the same position in the axle direction X.

The inner gap 8 is formed of a gap formed between a cylindrical tubular groove portion 16 formed in the fitting portion between the motor case 10 and the heat sink 43, and a cylindrical tubular protruding portion 17 that is formed in the control apparatus case 13 and is inserted into the groove portion 16. That is to say, the cylindrical tubular protruding portion 17 is inserted with a gap into the cylindrical tubular groove portion 16. The groove portion 16 and the protruding portion 17 are the gap forming portion 5 that forms the inner gap 8. The heat sink 43 forms part of the case 1. Describing in detail, the groove portion 16 is a cylindrical tubular groove that is formed at the end portion, at the axle-direction second side X2, of the fitting portion between the motor case 10 and the heat sink 43, that becomes recessed toward the axle-direction first side X1, and that extends in the circumferential direction over the whole circumference. The protruding portion 17 is a cylindrical tubular protruding portion that is formed at the end portion, at the axle-direction first side X1, of the control apparatus case 13, that protrudes toward the axle-direction first side X1, and that extends in the circumferential direction over the whole circumference.

The inner gap 8 is a gap having a U-shaped cross section. Accordingly, not only the contact area between the sealing material 6 and each of the groove portion 16 and the protruding portion 17, which are the gap forming portion 5, can be increased, but also both sides of the groove portion 16 can pinch the protruding portion 17, through the intermediary of the sealing material 6. As a result, the airtightness of the inner gap 8 is raised.

The outer gap 9 is formed of a gap between the annular endface, at the axle-direction second side X2, of the radial-direction outer portion of the groove portion 16 in the first circumferential wall 11 and the annular endface, at the axle-direction first side X1, of the radial-direction outer portion of the protruding portion 17 in the second circumferential wall 14. The outer gap 9 is a cylindrical tubular gap that opens toward radial-direction outer side. The annular endface, at the radial-direction outer side of the groove portion 16, of the first circumferential wall 11 and the annular endface, at the radial-direction outer side of the protruding portion 17, of the second circumferential wall 14 are a gap forming portion 5 that forms the outer gap 9. The outer gap 9 is provided at the radial-direction outer side of the inner gap 8 in such a manner as to be connected with the inner gap 8. Thus, for example, in the case where in the assembly process, the protruding portion 17 is inserted into the groove portion 16 that is filled with the uncured sealing material 6, the sealing material 6 that overflows from the inner gap 8 between the groove portion 16 and the protruding portion 17 can be stored in the outer gap 9.

The gap forming portion 5 is formed of a metal component to which the heat in the heat-generating members of one of or both of (both of, in this example) the motor 20 and the motor control apparatus 40, as electric apparatuses, is transferred. In Embodiment 1, one side of the gap forming portion 5 forming the inner gap 8 and the outer gap 9 includes the heat sink 43 and the motor case 10 that are in contact with the heat-generating members. Specifically, the groove portion 16 is formed in the fitting portion between the heat sink 43 and the motor case 10. The gap forming portion 5 for the outer gap 9 is formed of a portion, at the radial-direction outer side of the fitting portion, of the motor case 10. The heat sink 43 is a metal component made of a high-heat-conductivity metal material such as aluminum and is in contact with the power module 41 including the switching devices in the motor control apparatus 40; the heat in the power module 41 is transferred to the heat sink 43. The motor case 10 is a metal component made of a high-heat-conductivity metal material such as aluminum or iron. The heat of the power module 41 is transferred to the motor case 10, through the intermediary of the heat sink 43. The heat of the coil 23 in the motor 20 is transferred to the motor case 10, through the intermediary of the stator core 30 and the like. Accordingly, the heat of the heat sink 43 and the motor case 10 is transferred to the sealing material 6 filled into the inner gap 8 and the outer gap 9. In particular, because the heat of the power module 41 is directly transferred to the heat sink 43, the temperature thereof rises faster than that of the motor case 10 and hence the temperature thereof becomes high. The temperature of the portion, of the motor case 10, that is fitted to the heat sink 43 becomes approximately the same as that of the heat sink 43.

In the case where in the manufacturing process, operation tests are applied to the motor 20 and the motor control apparatus 40 for the sake of checking the operational actions thereof, heat generated in the power module 41, the coil 23, and the like heats the heat sink 43 and the motor case 10; thus, the sealing material 6 is heated, so that the curing of the sealing material 6 is facilitated. Alternatively, it may be allowed that in the manufacturing process, electric power is supplied to the motor 20 and the motor control apparatus 40 so as to perform rotation drive of the motor 20, for the purpose of curing the sealing material 6. As described above, the curing time is shortened by self-heating of the motor 20 and the motor control apparatus 40, so that the productivity can be raised.

1-3. Manufacturing Method for Case 1

The manufacturing method for case 1 will be explained.

Figure 3:
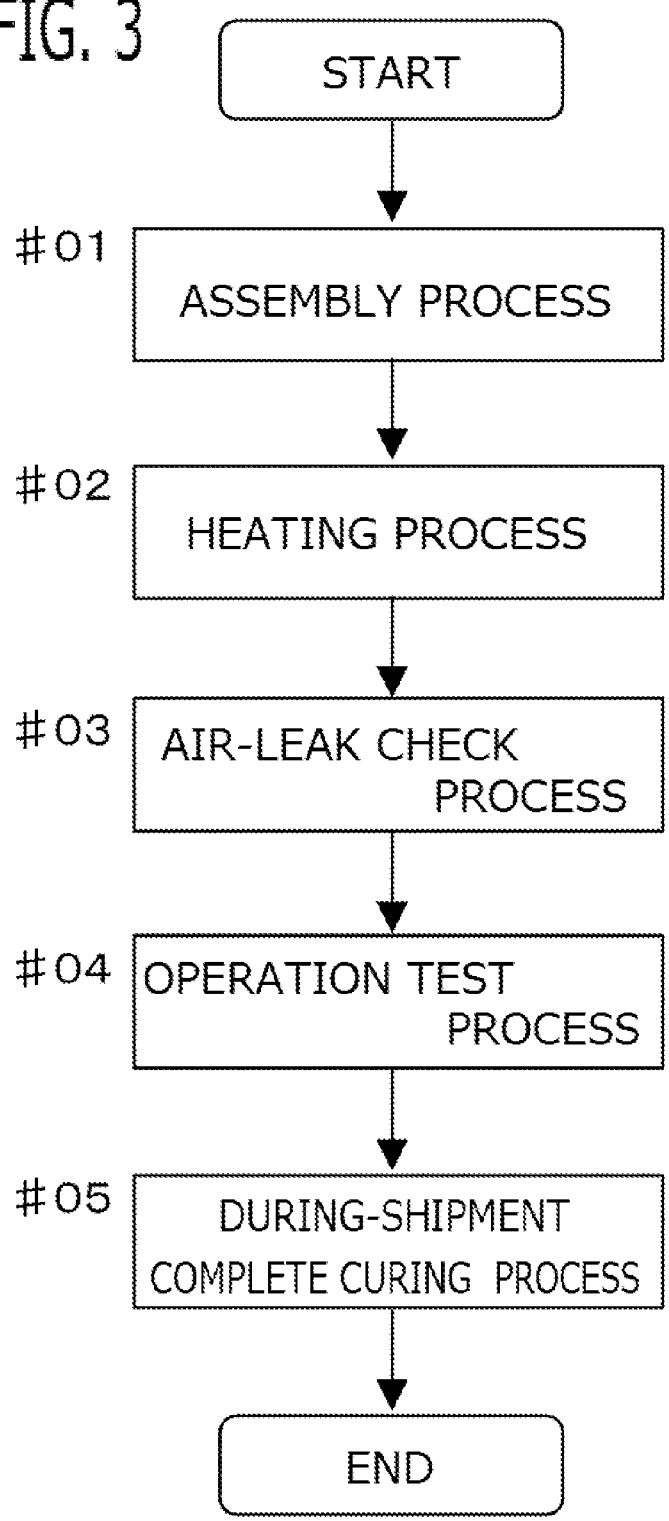
FIG. 3 is the flowchart of a manufacturing method for the case according to Embodiment 1 of the present invention.

As represented in the flowchart in FIG. 3, in the manufacturing method for the case 1, there is implemented an assembly process #01 in which two or more case members are combined with each other while an electric apparatus (both the motor 20 and the motor control apparatus 40, in this example) is contained inside and in which the uncured sealing material 6 consisting of mixed two liquids is filled into a gap formed in the junction portion 4 where the two or more case members are joined to each other. Then, in the manufacturing method for the case 1, there is implemented a heating process #02 in which the sealing material 6 filled in the assembly process #01 is heated. As described above, the sealing material 6 is a two-liquid-mixed addition-reaction-curable sealing material that has a normal-temperature curability and a thermal-curing facilitation property and that includes a platinum catalyst.

In this configuration, after the uncured sealing material 6 is filled in the assembly process #01, the sealing material 6 is heated in the heating process #02; thus, it is made possible to shorten the curing time so as to raise the productivity. Because the sealing material 6 has a normal-temperature curability, it is not required to perform heating up to the depth so as to completely cure the whole sealing material 6, the heating time can appropriately be shortened and hence the productivity can be raised.

In Embodiment 1, heating is performed, in the heating process #02, to such an extent that all of the sealing material 6 is not completely cured. Then, in the manufacturing method for the case 1, after the heating process #02, there is implemented an air-leak check process #03 in which an air-leak check is applied to the gap into which the sealing material 6 is filled. Then, in the manufacturing method for the case 1, after the air-leak check process #03, there is implemented a during-shipment complete curing process #05 in which while preparation for a shipment and the shipment are implemented, the whole sealing material 6 is completely cured at a normal temperature.

In this configuration, heating is performed to such an extent that the sealing material 6 is not completely cured; thus, as described above, the heating time in the heating process #02 is appropriately shortened and hence the productivity can be raised. Then, in the case where in the air-leak check process #03, it is determined that no problem exists in the airtightness of the sealing material 6, the air-leak check process #03 is followed by the next process;

while preparation for a shipment or the shipment is implemented, curing of the whole sealing material 6 is made to develop at a normal temperature, so that before the product is utilized, the sealing material 6 is completely cured. Because the curing time is shortened in the heating process #02, the sealing material 6 can completely be cured even in the case where the shipment period is so short that immediately after completion of shipment preparation, the shipment is implemented.

In Embodiment 1, in the assembly process #01, the motor 20 is mounted in the motor case 10. The heat sink 43, the power module 41, the connection wire module 46, and the control circuit 44 are put together. The heat sink 43 is mounted in the motor case 10. Then, the uncured sealing material 6 obtained by mixing two liquids with a platinum catalyst is filled into the groove portion 16 formed in the fitting portion between the motor case 10 and the heat sink 43. Then, the protruding portion 17 of the control apparatus case 13 is inserted into the groove portion 16 filled with the sealing material 6. The sealing material 6 that, due to the insertion of the protruding portion 17, overflows from the inner gap 8, which is a gap between the groove portion 16 and the protruding portion 17, is stored in the outer gap 9. Then, the motor case 10 and the control apparatus case 13 are fixed to each other by means of a fixation member such as a bolt.

Figure 4:
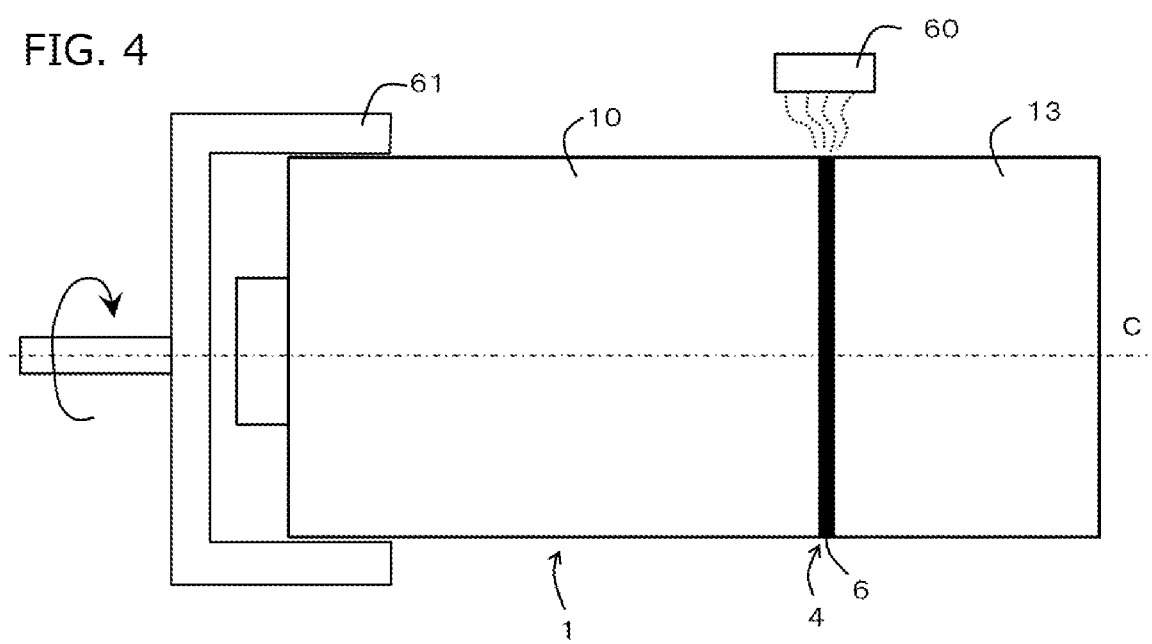
FIG. 4 is a schematic view for explaining a heating process utilizing a heater according to Embodiment 1 of the present invention.

In the heating process #02, partial heating of the portion filled with the sealing material 6 is performed. The partial heating of the case 1 makes it possible to shorten the heating time and to reduce the cost for the heating facilities. In Embodiment 1, as illustrated in FIG. 4, in the heating process #02, the heater 60 is utilized and heating of the sealing material 6 is performed in such a way that a holder 61 holding a plurality of case members is rotated. In this example, as the heater 60, a halogen heater is utilized. The halogen heater 60 is disposed at a part, in the circumferential direction, of the radial-direction outer side of the portion filled with the sealing material 6, in such a way that the radiation direction faces toward the radial-direction inner side; the radiant heat of the halogen heater 60 is radiated onto the surface of the portion filled with the sealing material 6, disposed at the radial-direction inner side. Then, the holder 61 is made to rotate on the rotation axle center C, so that the case 1 is rotated and hence the surface of the portion filled with the sealing material 6 is heated over the whole circumference thereof. Because the halogen heater 60 can be downsized, the cost for the heating facilities can be reduced and the installation space for the heating facilities can be reduced.

The sealing material 6 that is stored in the outer gap 9 is exposed to the outside of the case 1; thus, the heat of the heater 60 is readily transferred to the sealing material 6 and hence the sealing material 6 can be cured in a short time. For example, the heating temperature of the surface, of the portion filled with the sealing material 6, that is heated by the halogen heater 60 is set to 80° C. to 150° C.; the heating time is set to 1 minute to 10 minutes. The heating time is set to such an extent that the surface portion, at the radial-direction outer side, of the sealing material 6 is completely cured, but the depth, at the radial-direction inner side, of the sealing material 6 is not completely cured. For example, the heating time of the heater 60 may be set to a time during which the sealing material 6 stored in the outer gap 9 is completely cured. Because the surface portion of the sealing material 6 is completely cured, the airtightness can be secured while the manufacturing process is implemented. Because the heating time of the heater 60 is appropriately shortened, the productivity can be raised.

As the heater 60, an induction heater, a microwave generator, a heating furnace, an air heater, or the like may be utilized. Moreover, it may be allowed that instead of rotating the holder 61 holding the case 1, the heater 60 is rotated. Alternatively, it may be allowed that instead of rotating the holder 61 and the heater 60, the portion filled with the sealing material 6 is heated at once over the whole circumference thereof, by means of a ring-shaped heater 60 that covers the radial-direction outer side of the portion filled with the sealing material 6 over the whole circumference thereof or by means of a case-shaped heater 60 that covers the whole case 1.

In the air-leak check process #03, a pressurizer is connected to the openings of the case 1, such as the connector 45 and the bearing 25, and then air inside the case 1 is pressurized so that air-leak check of the portion filled with the sealing material 6 is performed.

In the time period between the air-leak check process #03 and the start of shipment preparation, in order to perform operation check, there is implemented an operation test process #04 in which the operation tests are applied to the motor 20 and the motor control apparatus 40. Because the operation test is performed, the heat sink 43 and the motor case 10 are heated, as described above, the sealing material 6 is heated and hence the curing of the sealing material 6 can be facilitated. In Embodiment 1, the inner gap 8 is formed of the heat sink 43 and the motor case 10. Accordingly, the operation test makes it possible to heat the depth of the uncured sealing material 6 and hence the curing thereof can be facilitated. In the operation test process #04, for example, a several-second operation test is performed twice or more times, so that an operation test is performed for totally about several tens of seconds.

In the during-shipment complete curing process #05, while shipment preparation such as packing the case 1 is performed or while shipment such as transporting the packed case 1 to the consignee is performed, the uncured portions of the sealing material 6, such as the depth and the like can completely be cured at a normal temperature.

2. Embodiment 2

Figure 5:
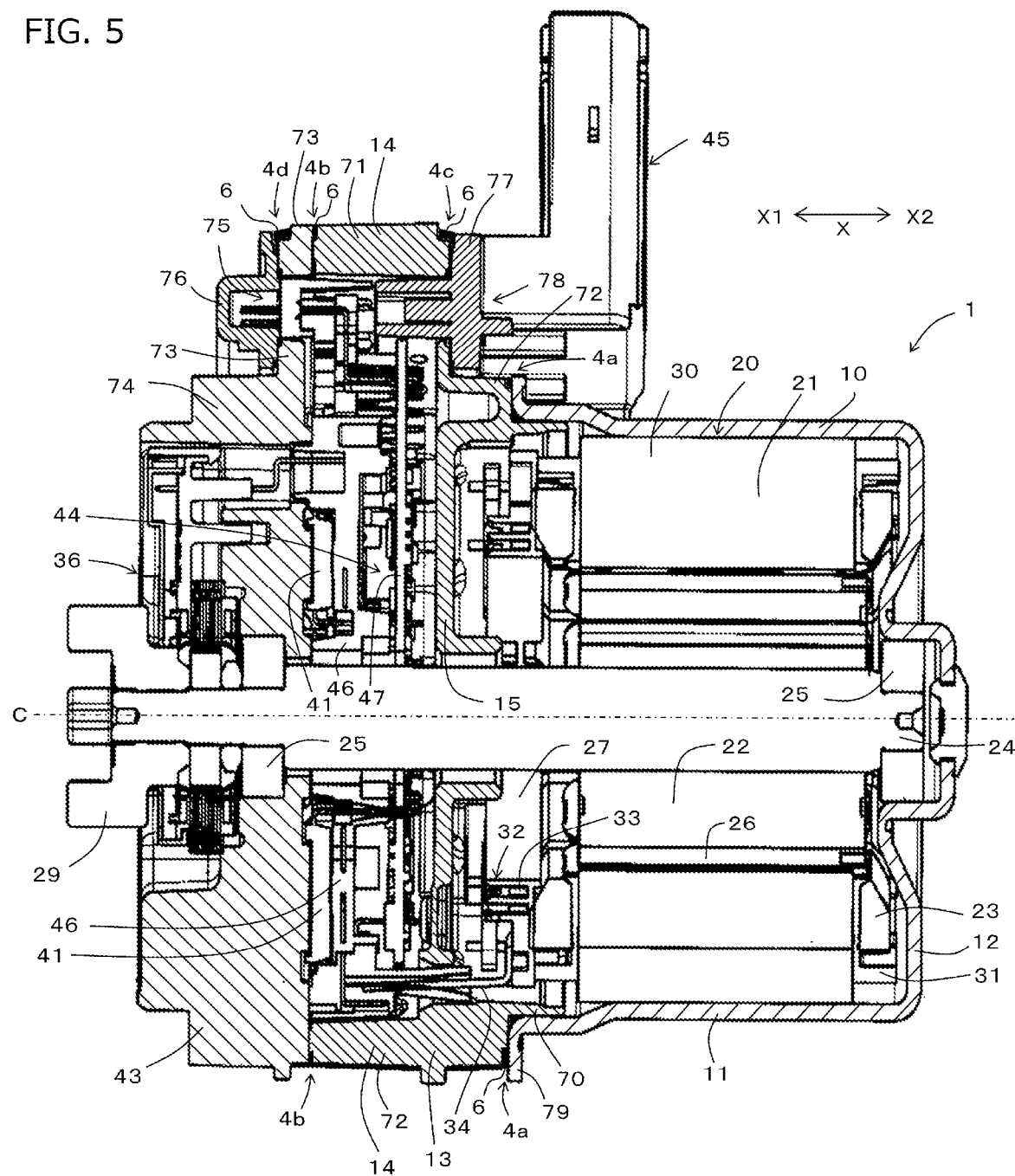
FIG. 5 is a cross-sectional view of a motor, a motor control apparatus, and a case according to Embodiment 2 of the present invention.
Figure 6:
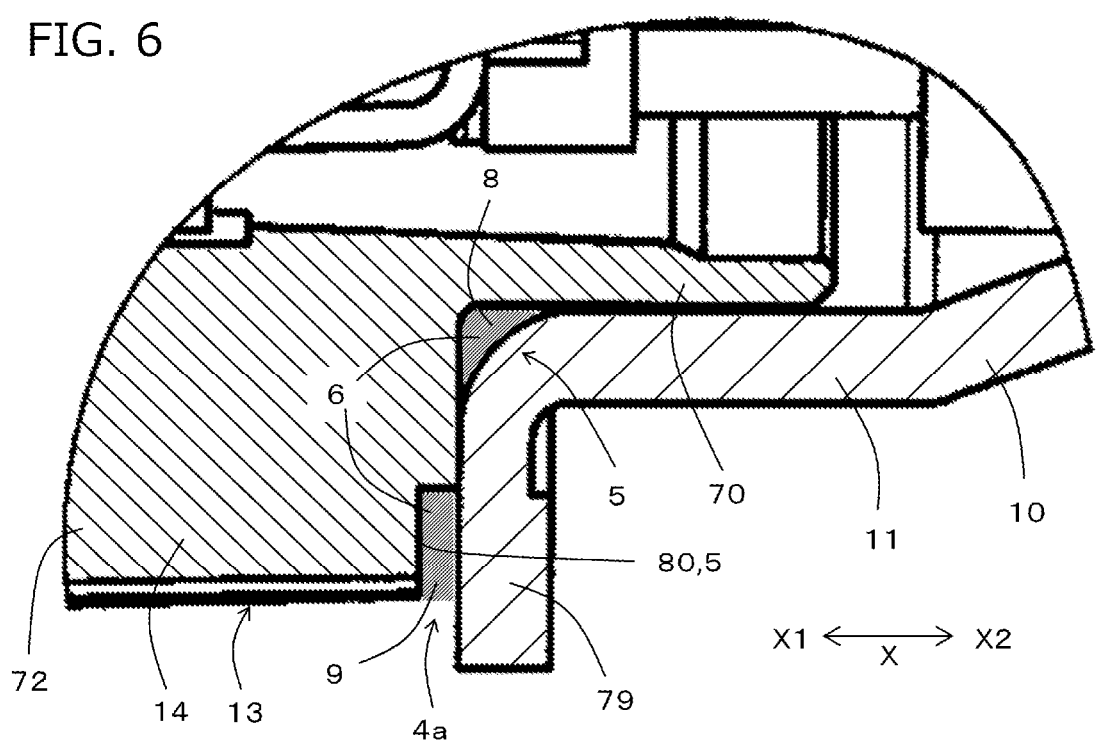
FIG. 6 is a principal-part cross-sectional view of a junction portion according to Embodiment 2 of the present invention.
Figure 7:
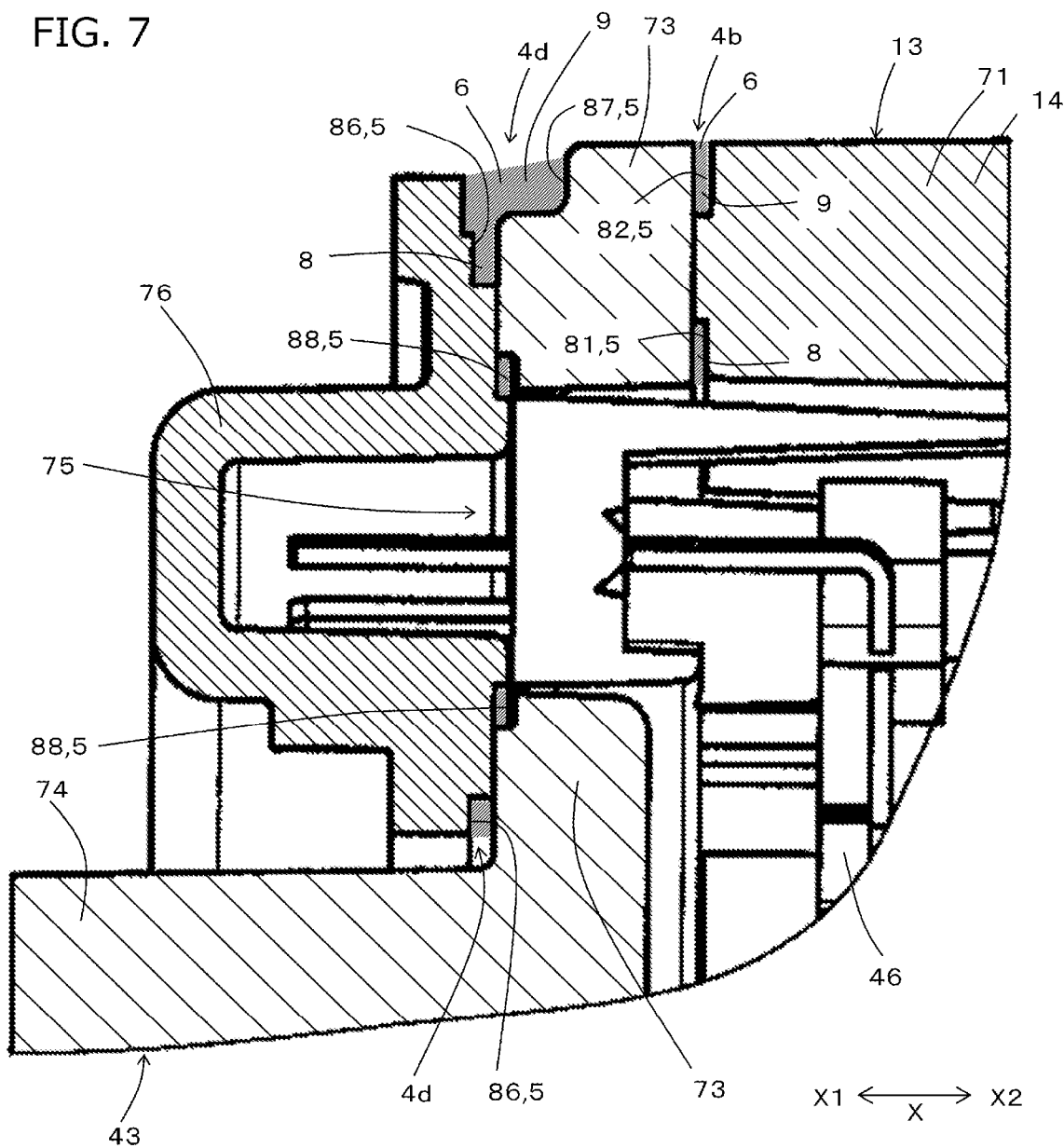
FIG. 7 is a principal-part cross-sectional view of a junction portion according to Embodiment 2 of the present invention.

A case 1 according to Embodiment 2 will be explained with reference to drawings. The explanation for constituent parts that are the same as those in Embodiment 1 will be omitted, and different constituent parts will mainly be explained. As is the case with Embodiment 1, the electric apparatus to be contained in the case 1 according to Embodiment 2 is an integrated unit including both the motor 20 and the motor control apparatus 40. The functional schematic configurations of the respective units in the motor 20 and the motor control apparatus 40 according to Embodiment 2 are the same as those in foregoing Embodiment 1; thus, the explanations therefor will be omitted. However, the arrangement configuration of the motor 20, the motor control apparatus 40, and the case 1 and the configuration of the junction portion 4 between the case members, according to Embodiment 2, are different from those in Embodiment 1. FIG. 5 is a cross-sectional view of the integrated unit and the case 1, taken along a plane that passes through the rotation axle center C of the motor 20. Each of FIGS. 6, 7, and 8 is a principal-part cross-sectional view in which the junction portion 4 of the case 1 in FIG. 5 is enlarged.

2-1. The Arrangement Configuration of the Motor 20, the Motor Control Apparatus 40, and the Case 1

In foregoing Embodiment 1, the motor control apparatus 40 is disposed at the opposite side of the coupling portion 29 of the rotor shaft 24, with respect to the motor 20. However, in Embodiment 2, the motor control apparatus 40 is disposed at a position, in the axle direction X, between the motor 20 and the coupling portion 29 of the rotor shaft 24. Explaining in greater detail, from the axle-direction second side X2 to the axle-direction first side X1 of the motor 20, the control circuit 44, the connection wire module 46, the power module 41, the heat sink 43, and the resolver 36 are arranged in that order. Unlike Embodiment 1, the heat sink 43 forms the external wall, at the axle-direction first side X1, of the case 1.

The motor case 10 is formed in the shape of a bottomed cylindrical tube that opens toward the axle-direction first side X1 and is provided with a cylindrical tubular first circumferential wall 11 that covers the radial-direction outer sides of the stator 21 and the rotor 22 and a disk-shaped first sidewall 12 that covers the opening, at the axle-direction second side X2, of the first circumferential wall 11. The portion, at the axle-direction second side X2, of the rotor shaft 24 is pivotably supported by the bearing 25, against the boss portion formed in the first sidewall 12. As is the case with Embodiment 1, the stator 21 and the rotor 22 are arranged inside the first circumferential wall 11. The coil connecting portion 32 is disposed at the axle-direction first side X1 of the coil 23.

A control apparatus case 13 is formed in the shape of a bottomed cylindrical tube that opens toward the axle-direction first side X1 and is provided with a cylindrical tubular second circumferential wall 14 that covers the radial-direction outer side of the motor control apparatus 40 (the power module 41, the connection wire module 46, and the control circuit 44, excluding the heat sink 43 and the resolver 36) and a disk-shaped second sidewall 15 that covers the opening, at the axle-direction second side X2, of the second circumferential wall 14. In the second sidewall 15, there are formed, at the central portion, a through-hole, in the axle direction X, through which the rotor shaft 24 passes and a through-hole, in the axle direction X, through which the motor connection wire 34 passes.

The control apparatus case 13 has a cylindrical tubular fitting boss portion 70 that extends from the second circumferential wall 14 toward the axle-direction second side X2. The outer circumferential surface of the fitting boss portion 70 is fitted and fixed to the inner circumferential surface of the first circumferential wall 11 of the motor case 10. As a result, the second sidewall 15 covers the opening, at the axle-direction first side X1, of the motor case 10. The respective outer diameters of the control apparatus case 13 and the motor case 10 are approximately equal to each other. The control apparatus case 13 is made of metal or resin.

The second circumferential wall 14 has an equal-diameter portion 72 having an outer diameter approximately equal to the outer diameter of the first circumferential wall 11 of the motor case 10 and an arc-shaped expanded-diameter portion 71, which is a portion, of the second circumferential wall 14, that lies within a predetermined angle range (e.g., 100°) in the circumferential direction and is obtained by expanding the portion at the axle-direction first side X1 by a predetermined width from the outer diameter of the first circumferential wall 11 of the motor case 10. The expanded-diameter portion 71 protrudes from the first circumferential wall 11 toward the radial-direction outer side; an opening portion 78 that opens toward the axle-direction second side X2 is formed in the expanded-diameter portion 71. The opening portion 78 is formed in the shape of an arc when viewed in the axle direction X. A connector 45 is mounted in the opening portion 78 so as to cover the opening.

The connector 45 is provided with power source connection terminals to be connected with the power source, external connection terminals to be connected with an external apparatus, and the like. The connector 45 has an arc-plate-shaped connector junction portion 77 that abuts against the endface, at the axle-direction second side X2 of the opening portion 78, of the expanded-diameter portion 71 in the control apparatus case 13. The respective outer diameters of the connector junction portion 77 and the junction portion of the expanded-diameter portion 71 are approximately equal to each other.

In a housing space, which is at the radial-direction inner side of the second circumferential wall 14 and at the axle-direction first side X1 of the second sidewall 15, the control circuit 44, the connection wire module 46, and the power module 41 are arranged in that order from the axle-direction second side X2.

The heat sink 43 covers the opening, at the axle-direction first side X1, of the second circumferential wall 14. The endface, at the axle-direction second side X2, of the heat sink 43 abuts against the endface, at the axle-direction first side X1, of the second circumferential wall 14. The respective outer diameters of the heat sink 43 and the junction portion of the second circumferential wall 14 are approximately equal to each other. Specifically, the heat sink 43 has a cylindrical columnar equal-diameter portion 74 having an outer diameter approximately equal to the outer diameter of the equal-diameter portion 72 of the control apparatus case 13 and an arc-shaped expanded-diameter portion 73 that faces the expanded-diameter portion 71 of the control apparatus case 13 and has an outer diameter approximately equal to the outer diameter of the expanded-diameter portion 71. In the expanded-diameter portion 73 of the heat sink 43, there is formed an opening portion 75 that penetrates the expanded-diameter portion 73 in the axle direction X and that is in the shape of an arc when viewed in the axle direction X. The opening portion 75 of the heat sink 43 is a hole for connecting the connection wire module 46 with the connection terminals of the connector 45 by means of a bolt or the like from the outside. The opening portion 75 of the heat sink 43 is covered by an opening cover 76. The opening cover 76 is formed in the shape of an arc when viewed in the axle direction X, in accordance with the shape of the opening portion 75 of the heat sink 43. The opening cover 76 abuts against and is fixed to the endface, at the axle-direction first side X1 of the opening portion 75, of the expanded-diameter portion 73 of the heat sink 43. The respective outer diameters of the opening cover 76 and the junction portion of the expanded-diameter portion 73 are approximately equal to each other.

The power module 41 abuts against the endface, at the axle-direction second side X2, of heat sink 43; heat generated by the power module 41 is transferred to the endface, at the axle-direction second side X2, of heat sink 43. The heat transferred from the power module 41 and the like to the heat sink 43 is radiated to the outside through the outer surface of the heat sink 43, transferred to the control apparatus case 13 and the motor case 10 and then is radiated from the outer surfaces thereof to the outside, or transferred to an external mechanism (the case of a worm-gear mechanism, in this example) to be coupled with the heat sink 43. The outer circumferential surface of the equal-diameter portion 74 in the heat sink 43 is fitted to the coupling portion of the external mechanism and is fixed thereto by means of a bolt or the like (unillustrated).

A through-hole through which the rotor shaft 24 passes is formed in the heat sink 43, the connection wire module 46, the control circuit 44, and the second sidewall 15 of the control apparatus case 13; the rotor shaft 24 extends therethrough from the rotor 22 toward the axle-direction first side X1. The inner circumferential surface of the through-hole in the heat sink 43 pivotably supports the rotor shaft 24 through the intermediary of the bearing 25. The resolver 36 is disposed at the axle-direction first side X1 of the heat sink 43. The inner circumferential surface of the resolver rotor is fitted and fixed to the outer circumferential surface of the rotor shaft 24 that penetrates the heat sink 43 and extends toward the axle-direction first side X1. A resolver holder for holding the resolver stator and the connection wires therefor is fixed to the wall, at the axle-direction first side X1, of the heat sink 43. A through-hole through which the connection wires for the resolver 36 pass in the axle direction X and the like are formed in the heat sink 43. The connection wires for the resolver 36 are connected with the connection wire module 46 and the control circuit 44. A coupling portion 29 for coupling the rotor shaft 24 with the external mechanism (unillustrated) is fixed to the end portion, at the axle-direction first side X1, of the rotor shaft 24.

The motor case 10, the control apparatus case 13, and the heat sink 43 are fixed to one another by means of a fixation member such as a bolt (unillustrated). The connector 45 and the opening cover 76 are fixed to the control apparatus case 13 by means of fixation members such as bolts (unillustrated).

2-2. The Configuration of the Junction Portion 4 of the Case Member

As is the case with Embodiment 1, the case 1 has the gap forming portion 5 that forms a gap in the junction portion where two or more case members are joined to each other and the sealing material 6 filled into the gap of the gap forming portion 5. The sealing material 6 that is the same as that in Embodiment 1 is utilized. That is to say, the sealing material 6 is a two-liquid-mixed addition-reaction-curable sealing material that has a normal-temperature curability and includes a platinum catalyst; the sealing material 6 has a thermal-curing facilitation property.

In Embodiment 2, the case members, into the junction portions of which the sealing material 6 is filled are the motor case 10, the control apparatus case 13, the heat sink 43, the connector 45, and the opening cover 76. In a junction portion 4a between the control apparatus case 13 and the motor case 10, the sealing material 6 is filled into a gap formed by the gap forming portion 5. In a junction portion 4b between the control apparatus case 13 and the heat sink 43, the sealing material 6 is filled into a gap formed by the gap forming portion 5. In a junction portion 4c between the control apparatus case 13 and the connector 45, the sealing material 6 is filled into a gap formed by the gap forming portion 5. In a junction portion 4d between the heat sink 43 and the opening cover 76, the sealing material 6 is filled into a gap formed by the gap forming portion 5.

As is the case with Embodiment 1, the gap forming portion 5 forms an inner gap 8 and an outer gap 9, which is provided outside the inner gap 8 and opens toward the outside. The gap forming portion 5 is formed of a metal component to which the heat in the heat-generating members of one of or both of the motor 20 and the motor control apparatus 40, as electric apparatuses, is transferred.

At first, the gap in the junction portion 4a between the motor case 10 and the control apparatus case 13 will be explained. As illustrated in FIG. 6, the motor case 10 has a cylindrical tubular flange portion 79 that extends from the end portion, at the axle-direction first side X1, of the first circumferential wall 11 toward the radial-direction outer side. The control apparatus case 13 has a cylindrical tubular fitting boss portion 70 that extends from the radial-direction inner end portion of the equal-diameter portion 72 in the control apparatus case 13 toward the axle-direction second side X2. The outer circumferential surface of the fitting boss portion 70 is fitted to the inner circumferential surface of the first circumferential wall 11; the endface, at the axle-direction second side X2, of the equal-diameter portion 72 abuts against the endface, at the axle-direction first side X1, of the flange portion 79. Gaps are formed in the junction portion 4a among these members.

Specifically, the connection portion between the first circumferential wall 11 and the flange portion 79 is rounded; the inner gap 8 is formed between the connection portion between the fitting boss portion 70 and the equal-diameter portion 72 and the connection portion between the first circumferential wall 11 and the flange portion 79. These connection portions are the gap forming portion 5 that forms the inner gap 8. A cylindrical tubular recess portion 80 that is depressed toward the axle-direction first side X1 is formed in the respective end portions, at the axle-direction second side X2 and at the radial-direction outer side, of the equal-diameter portion 72. The recess portion 80 and the flange portion 79 facing the recess portion 80 are the gap forming portion 5 that forms the outer gap 9.

Thus, for example, in the case where in the assembly process, the fitting boss portion 70 is fitted to the first circumferential wall 11 after the uncured sealing material 6 is coated on the connection portion between the fitting boss portion 70 and the equal-diameter portion 72, the sealing material 6 that overflows from the inner gap 8 toward the radial-direction outer side can be stored in the outer gap 9.

The motor case 10 is a metal component made of aluminum, iron, or the like; the heat of the component, such as the coil 23, in the motor 20 is transferred to the motor case 10. Accordingly, the heat of the motor case 10 is transferred to the sealing material 6 filled into the inner gap 8 and the outer gap 9; thus, the curing can be facilitated. In the case where the control apparatus case 13 is a metal component made of aluminum or the like, heat is transferred from the heat sink 43 to the control apparatus case 13 and then can be transferred to the sealing material 6.

Next, the gap in the junction portion 4b between the heat sink 43 and the control apparatus case 13 will be explained. As illustrated in FIG. 7, a cylindrical tubular recess portion 81 that is depressed toward the axle-direction second side X2 is formed in the respective end portions, at the axle-direction first side X1 and at the radial-direction inner side, of the second circumferential wall 14 of the control apparatus case 13. The recess portion 81 and a portion, of the heat sink 43, that faces the recess portion 81 are the gap forming portion 5 that forms the inner gap 8. A cylindrical tubular recess portion 82 that is depressed toward the axle-direction second side X2 is formed in the respective end portions, at the axle-direction first side X1 and at the radial-direction outer side, of the second circumferential wall 14 of the control apparatus case 13. The recess portion 82 and a portion, of the heat sink 43, that faces the recess portion 82 are the gap forming portion 5 that forms the outer gap 9.

The heat sink 43 is a metal component made of aluminum or the like; heat of the power module 41 and the like is transferred to the heat sink 43. Accordingly, the heat of the heat sink 43 is transferred to the sealing material 6 filled into the inner gap 8 and the outer gap 9; thus, the curing can be facilitated.

Next, the gap in the junction portion 4d between the heat sink 43 and the opening cover 76 will be explained. As illustrated in FIG. 7, an arc-cylindrical-tubular recess portion 86 that is depressed toward the axle-direction first side X1 is formed in the respective end portions, at the axle-direction second side X2 and at the outer circumferential side, of the opening cover 76. The recess portion 86 and a portion, of the heat sink 43, that faces the recess portion 86 are the gap forming portion 5 that forms the inner gap 8. An arc-shaped recess portion 87 that is depressed toward the axle-direction second side X2 is formed in the respective end portions, at the axle-direction first side X1 and at the radial-direction outer side, of the expanded-diameter portion 73 of the control apparatus case 13. The recess portion 87 and a portion, of the recess portion 86 in the opening cover 76, that faces the recess portion 87 are the gap forming portion 5 that form the outer gap 9. An arc-cylindrical-tubular recess portion 88 that is depressed toward the axle-direction second side X2 is formed in the end portion, at the axle-direction first side X1, of the opening portion 75 of the heat sink 43. Both the recess portion 88 and a portion, of the opening cover 76, that faces the recess portion 88 are the gap forming portion 5 that forms the inner gap 8. The heat of the heat sink 43 is transferred to the sealing material 6; thus, the curing can be facilitated.

Next, the gap in the junction portion 4c between the control apparatus case 13 and the connector 45 will be explained. As illustrated in FIG. 8, an arc-cylindrical-tubular recess portion 83 that is depressed toward the axle-direction second side X2 is formed in the respective end portions, at the axle-direction first side X1 and at the circumferential outer side, of the connector junction portion 77 of the connector 45. The recess portion 83 and a portion, such as the expanded-diameter portion 71 of the control apparatus case 13, that faces the recess portion 83 are the gap forming portion 5 that forms the inner gap 8. An arc-shaped recess portion 84 that is depressed toward the axle-direction first side X1 is formed in the respective end portions, at the axle-direction second side X2 and at the radial-direction outer side, of the expanded-diameter portion 71 of the control apparatus case 13. The recess portion 84 and a portion, of the recess portion 83 in the connector 45, that faces the recess portion 84 are the gap forming portion 5 that forms the outer gap 9. An arc-cylindrical-tubular recess portion 85 that is depressed toward the axle-direction first side X1 is formed in the end portion, at the axle-direction second side X2, of the opening portion 78 of the control apparatus case 13. The recess portion 85 and a portion, of the connector junction portion 77, that faces the recess portion 85 are the gap forming portion 5 that forms the inner gap 8. In the case where the control apparatus case 13 is a metal component made of aluminum or the like, heat is transferred from the heat sink 43 to the control apparatus case 13 and then can be transferred to the sealing material 6.

2-3. Manufacturing Method for Case 1

The manufacturing method for case 1 will be explained.

The manufacturing method for case 1 according to Embodiment 2 is basically the same as the manufacturing method according to Embodiment 1; thus, the different points will mainly be explained.

In Embodiment 2, in the assembly process #01, the motor is mounted in the motor case 10. The heat sink 43, the power module 41, the connection wire module 46, and the control circuit 44 are put together and then are mounted to the control apparatus case 13. Then, the connector 45 is mounted to the control apparatus case 13. After that, through the opening portion 75 of the heat sink 43, the connection terminals of the connector 45 are connected with the connection wire module 46 from the outside; then, the opening cover 76 is mounted on the heat sink 43 so that the opening portion 75 is covered. The motor case 10 and the control apparatus case 13 are put together. In this situation, when or after the case members are put together, the uncured sealing material 6 obtained by mixing two liquids with a platinum catalyst is filled into the junction portions 4a through 4d of the case members. The case members are fixed to one another by means of fixation members such as bolts.

In the heating process #02, because there exist a plurality of filling portions for the sealing material 6, one or more heater 60 are arranged at the radial-direction outer side of the plurality of filling portions and the holder 61 is rotated, so that the plurality of filling portions are heated simultaneously.

Other Embodiments

Lastly, other embodiments of the present invention will be explained. Each of the configurations of embodiments to be explained below is not limited to be separately utilized but can be utilized in combination with the configurations of other embodiments as long as no discrepancy occurs.

(1) In each of the foregoing embodiments, as an example, there has been explained the case where the electric apparatus to be contained in the case 1 is an integrated unit including both the motor 20 and the motor control apparatus 40. However, the electric apparatus to be contained in the case 1 may be either the motor 20 or the motor control apparatus 40. That is to say, the electric apparatus to be contained in the case 1 may be one of or both of the motor 20 and the motor control apparatus 40.

Alternatively, the electric apparatus to be contained in the case 1 may be other than one of or both of the motor 20 and the motor control apparatus 40, e.g., one of or both of an electric power converter and an control apparatus for the electric power converter.

(2) In each of the foregoing embodiments, as an example, there has been explained the case where the two-liquid-mixed addition-reaction-curable sealing material 6 that has a normal-temperature curability and includes a platinum catalyst is silicone. However, the two-liquid-mixed addition-reaction-curable sealing material 6 that has a normal-temperature curability and includes a platinum catalyst may be a material other than silicone, for example, an epoxy resin or the like.

(3) In each of the foregoing embodiments, as an example, there has been explained the case where the motor 20 is a permanent-magnet synchronous motor. However, the motor 20 may be another kind of motor, for example, a permanent-magnet DC commutator motor or the like, and the configuration of the motor control apparatus 40 may be changed depending on the kind of the motor.

(4) In each of the foregoing embodiments, as an example, there has been explained the case where the two or more case members in the case 1 are the motor case 10, the control apparatus case 13, the heat sink 43, and the like. However, the number of the two or more case members may be an arbitrary number that is the same as or larger than 2 and the respective shapes thereof may be arbitrary; for example, each of the two or more case members may be more subdivided or the two or more case members may be more integrated, in comparison with the case members in each of the foregoing embodiments.

(5) In each of the foregoing embodiments, as an example, there has been explained the case where in each of the junction portions 4, the gap forming portion 5 forms the inner gap 8 and the outer gap 9. However, in each of the junction portions 4, the gap forming portion 5 may form an arbitrary number of gaps, for example, one or three gaps.

(6) In each of the foregoing embodiments, as an example, there has been explained the case where in the heating process #02, the sealing material 6 is heated by the heater 60 such as a halogen heater or the like. However, it may be allowed that in the heating process #02, instead of being heated by the heater 60, the sealing material 6 is heated by the heat, of the heat-generating members in one of or both of the motor 20 and the motor control apparatus 40, as electric apparatuses, that is generated by supplying electric power to both the motor 20 and the motor control apparatus 40 so that the motor is rotated and driven. The rotation drive of the motor 20 may be performed in order to implement the operation test on the motor 20 and the motor control apparatus 40 or in order to heat the sealing material 6.

(7) In each of the foregoing embodiments, as an example, there has been explained the case where in the heating process #02, the sealing material 6 is heated to such an extent that it is not completely cured. However, it may be allowed that in the heating process #02, the sealing material 6 is heated to the extent that it is completely cured.

(8) In each of the foregoing embodiments, as an example, there has been explained the case where the air-leak check process #03 is performed. However, it may be allowed that the air-leak check process #03 is not performed.

(9) In each of the foregoing embodiments, as an example, there has been explained the case where the operation test process #04 is performed in a time period between the air-leak check process #03 and the during-shipment complete curing process #05. However, it may be allowed that the operation test process #04 is performed in a time period either between the assembly process #01 and the heating process #02 or between the heating process #02 and the air-leak check process #03.

In the scope of the present invention, the embodiments thereof can freely be combined with one another and can appropriately be modified or omitted.

INDUSTRIAL APPLICABILITY

The present invention can appropriately be applied to a case of an electric apparatus provided with two or more case members that are joined to each other and the manufacturing method therefor.

REFERENCE SIGNS LIST

1: case
4: junction portion
5: gap forming portion
6: sealing material
7: metal component
8: inner gap
9: outer gap
10: motor case
13: control apparatus case
16: groove portion
17: protruding portion
20: motor
24: rotor shaft
35: motor sidewall
36: resolver
40: motor control apparatus
41: power module
43: heat sink
44: control circuit
45: connector
46: connection wire module
60: heater
76: opening cover
X: axle direction
X1: axle-direction first side
X2: axle-direction second side

The invention claimed is:

1. A manufacturing method for a case of an electric apparatus, the method comprising:
    an assembly process in which two or more case members are combined with each other while an electric apparatus is contained therein and an uncured two-liquid-mixed sealing material is filled into a gap formed in a junction portion where the two or more case members are joined to each other; and
    a heating process in which the sealing material filled in the assembly process is heated,
    wherein in the heating process, heating is performed to such an extent that all of the sealing material is not completely cured,
    wherein after the heating process, there is implemented an air-leak check process in which an air-leak check is applied to the gap into which the sealing material is filled, and
    wherein the sealing material is a two-liquid-mixed addition-reaction-curable sealing material that is curable at a temperature of 25° C., is thermally curable by the heating in the heating process, and includes a platinum catalyst,
    wherein as the gap, an inner gap and an outer gap that is provided outside the inner gap and opens toward the outside are formed,
    wherein the heating process, radiant heat of a heater is radiated onto a surface of a filled portion of the sealing material filled in the outer gap, from outside of the junction portion,
    wherein in the heating process, a heating time is set to such an extent that an outer side surface portion of the sealing material is completely cured, but an inner side depth of the sealing material is not completely cured,
    wherein the inner gap is formed of a metal component to which heat of heat-generating members of one or both of a motor and a motor control apparatus, as the electronic apparatus, is transferred,
    wherein heat of one or both of a coil of the motor and a power module that is included in the motor control apparatus and is provided with a switching device is transferred to the metal component, and
    wherein after the air-leak check process, or between the heating process and the air-leak check process, or between the assembly process and the heating process, there is implemented an operation test process in which an operation test is applied to the motor and the motor control apparatus, and the inner side depth is cured by heat of the metal component heated by the operation test.

2. The manufacturing method for a case of an electric apparatus according to claim 1, wherein in the heating process, heating of the sealing material is performed in such a way that a holder holding the two or more case members is rotated.

3. The manufacturing method for a case of an electric apparatus according to claim 1, wherein after the air-leak check process, there is implemented a during-shipment complete curing process in which while preparation for a shipment and the shipment are implemented, the whole of the sealing material is completely cured.

4. The manufacturing method for a case of an electric apparatus according to claim 1, wherein the sealing material is a silicone having a radical (—Si—CH$_2$—CH$_2$—Si—) obtained by applying a platinum-catalyst crosslink to a first silicone, as a first liquid, having a radical (—Si—H) and a second silicone, as a second liquid, having a radical (—Si—CH=CH$_2$).

* * * * *